(12) United States Patent
Kuwabara

(10) Patent No.: US 9,279,665 B2
(45) Date of Patent: Mar. 8, 2016

(54) METHOD FOR MEASURING FILM THICKNESS DISTRIBUTION

(71) Applicant: SHIN-ETSU HANDOTAI CO., LTD., Tokyo (JP)

(72) Inventor: Susumu Kuwabara, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 86 days.

(21) Appl. No.: 14/362,465

(22) PCT Filed: Nov. 27, 2012

(86) PCT No.: PCT/JP2012/007580
§ 371 (c)(1),
(2) Date: Jun. 3, 2014

(87) PCT Pub. No.: WO2013/099107
PCT Pub. Date: Jul. 4, 2013

(65) Prior Publication Data
US 2014/0293295 A1 Oct. 2, 2014

(30) Foreign Application Priority Data
Dec. 28, 2011 (JP) .................................. 2011-287397

(51) Int. Cl.
*G01B 11/06* (2006.01)
*H01L 21/66* (2006.01)

(52) U.S. Cl.
CPC ............ *G01B 11/0633* (2013.01); *G01B 11/06* (2013.01); *G01B 11/0625* (2013.01); *H01L 22/12* (2013.01); *G01B 2210/56* (2013.01); *H01L 2924/0002* (2013.01)

(58) Field of Classification Search
USPC ...................... 356/237.1–241.6, 242.1–243.8, 356/426–431, 600–640
See application file for complete search history.

(56) References Cited

U.S. PATENT DOCUMENTS 4,999,508 A * 3/1991 Hyakumura ....... G01B 11/0625 250/559.27
5,440,141 A * 8/1995 Horie ................. G01B 11/0625 250/226

(Continued)

FOREIGN PATENT DOCUMENTS

CN 1140832 A 1/1997
CN 1664493 A 9/2005

(Continued)

OTHER PUBLICATIONS

Jan. 3, 2015 Search Report issued on Jan. 9, 2015 in Application No. TW 101145653.

(Continued)

*Primary Examiner* — Kara E Geisel
*Assistant Examiner* — Jarreas C Underwood
(74) *Attorney, Agent, or Firm* — Oliff PLC

(57) ABSTRACT

A method for measuring film thickness distribution, including calculating profile P1 indicating wavelength dependence of a reflectance of a first wafer being an object measured with respect to a light at wavelengths not less than a wavelength region of visible light; calculating profile P21 indicating wavelength dependence of a reflectance of a second wafer to light at wavelengths not less than wavelength region of visible light; obtaining a wavelength λ1 observed when profile P31 of a difference between calculated profiles P1 and P21 becomes zero; and selecting waveband including the obtained wavelength λ1 as a waveband of light for use in film thickness distribution measurement by reflection spectroscopy. The film thickness distribution of the first thin film is measured by reflection spectroscopy in a manner that a surface of the first wafer is irradiated with a light to selectively measure only reflected light at a selected waveband.

12 Claims, 21 Drawing Sheets

(56) References Cited

U.S. PATENT DOCUMENTS

| | | | | |
|---|---|---|---|---|
| 5,555,472 | A * | 9/1996 | Clapis | G01B 11/0625 356/504 |
| 5,883,720 | A * | 3/1999 | Akiyama | G01B 11/0625 356/632 |
| 6,190,153 | B1 * | 2/2001 | Tsuzukiyama | B29C 55/143 264/40.1 |
| 7,092,110 | B2 * | 8/2006 | Balasubramanian | G01N 21/4788 250/559.22 |
| 7,126,700 | B2 * | 10/2006 | Bao | G01B 11/303 356/601 |
| 7,330,279 | B2 * | 2/2008 | Vuong | G03F 7/705 250/559.19 |
| 8,976,369 | B2 * | 3/2015 | Kuwabara | H01L 22/12 250/559.27 |
| 2002/0173084 | A1 * | 11/2002 | Ohkawa | G01B 11/0625 438/149 |
| 2012/0035863 | A1 | 2/2012 | Kuwabara | |
| 2013/0063733 | A1 | 3/2013 | Kuwabara | |

FOREIGN PATENT DOCUMENTS

| | | |
|---|---|---|
| CN | 101709952 A | 5/2010 |
| EP | 0 754 932 A2 | 1/1997 |
| JP | A-2-179402 | 7/1990 |
| JP | A-7-55435 | 3/1995 |
| JP | A-7-260437 | 10/1995 |
| JP | A-10-253324 | 9/1998 |
| JP | A-11-86350 | 3/1999 |
| JP | A-11-160028 | 6/1999 |
| JP | A-2002-343842 | 11/2002 |
| JP | 2010-2327 | 1/2010 |
| JP | A-2010-2327 | 1/2010 |
| JP | A-2011-249621 | 12/2011 |
| TW | I290614 B | 12/2007 |
| WO | 2010/125747 A1 | 11/2010 |

OTHER PUBLICATIONS

Jul. 7, 2015 Extended Search Report issued in European Application No. 12863632.1.

Ling, Yunfeng et al., "Thin film thickness variation measurement using dual LEDs and reflectometric interference spectroscopy model in biosensor". Proc. of SPIE, vol. 7559, (2010), pp. 75590K-1 to 75590K-7.

International Search Report issued in International Patent Application No. PCT/JP2012/007580 dated Jan. 15, 2013.

Nov. 20, 2015 Search Report issued in Chinese Application No. 2012800643664.

* cited by examiner

METHOD FOR MEASURING FILM THICKNESS DISTRIBUTION

TECHNICAL FIELD

The present invention relates to a method for measuring film thickness distribution of wafers with two layers of thin films for use in semiconductor devices by reflection spectroscopy.

BACKGROUND ART

In recent years, with miniaturization of a design rule, SOI wafers, each having an ultrathin film (i.e., an ultrathin SOI layer) which needs to be particularly high uniform, are used for SOI devices, such as FD-SOI (Fully Depleted SOI) devices, FinFET devices, and Si nanowire transistors. In these devices, the uniformity of SOI film thicknesses and buried oxide film (BOX film) thicknesses is important to determine the characteristics of transistors.

An conventional method for measuring film thickness distribution that calculates the film thickness distribution of a thin film of such a wafer with a thin film, the wafer with a substrate having a thin film on the surface thereof, generally performs film thickness measurement in each point by spectroscopic ellipsometry or reflection spectroscopy, but a film thickness distribution measurement unit that can perform high-throughput, high-precision film thickness distribution measurement on the whole surface of the wafer has not been commercially available.

In point measurement by spectroscopic ellipsometry or reflection spectroscopy, the spectrum in a certain wavelength range (in general, a visible light range) is obtained for each measurement point and fitting is performed on a model film structure with respect to the spectrum, whereby a film thickness in each measurement point is obtained. Therefore, an attempt to perform high-throughput and high-precision measurement on the whole surface of the wafer extremely increases the number of measurement points, which makes it practically impossible to perform measurement due to the amount of calculation and time constraint.

Moreover, a wavelength region with a wide wavelength range is required to perform spectral measurement, which makes it virtually impossible to increase the spatial resolution and perform multipoint film thickness measurement.

As described above, the challenge is to perform measurement of the film thickness distribution of a wafer with a thin film, such as an SOI wafer, at high density, with a high degree of precision, and in a short time.

Incidentally, in Patent Document 1, a method for measuring two layers: an SOI layer and a BOX layer at the same time by using a light of two wavelengths in an ultraviolet wavelength region by reflection spectroscopy is described.

In Patent Document 2, a technique of irradiating SOI with a white light, dispersing the reflected light according to wavelength, and calculating an SOI layer film thickness from wavelength-specific interference information is disclosed.

In Patent Document 3, for the purpose of measuring the film thickness of an object to be measured with a plurality of layers formed on a substrate with a higher degree of precision, a method for determining the film thickness of an object to be measured by fitting by using a light source having a wavelength component mainly in an infrared band and repeatedly calculating theoretical reflectance (spectrum) at each wavelength is described.

CITATION LIST

Patent Literature

Patent Document 1: Japanese Unexamined Patent Application Publication No. H07-55435
Patent Document 2: Japanese Unexamined Patent Application Publication No. 2002-343842
Patent Document 3: Japanese Unexamined Patent Application Publication No. 2010-2327

SUMMARY OF INVENTION

Technical Problem

The present invention has been made in view of the above-described problems and an object thereof is to provide a method for measuring film thickness distribution that can precisely measure the film thickness distribution of a wafer with thin films at high density in a short time by the reflection spectroscopy.

Solution to Problem

To attain the above-described object, the present invention provides a method for measuring a film thickness distribution of a first thin film of a first wafer with thin films by reflection spectroscopy, the first wafer having the first thin film formed on a surface of a substrate and a second thin film formed on a surface of the first thin film, the method comprising: calculating a profile P1 by a simulation, the profile P1 indicating wavelength dependence of a reflectance of the first wafer with respect to a light at wavelengths not less than a wavelength region of visible light, the first wafer being an object to be measured; calculating a profile P21 by a simulation, the profile P21 indicating wavelength dependence of a reflectance of a second wafer with respect to a light at wavelengths not less than a wavelength region of visible light, the second wafer having thin films including a second thin film that is t [nm] thinner or thicker than a set film thickness T2 of the second thin film of the first wafer; calculating a profile P31 (=P21−P1) of a difference between the calculated profiles P1 and P21 and obtaining a wavelength $\lambda 1$ observed when the calculated profile P31 of the difference becomes zero; and selecting a waveband including the obtained wavelength $\lambda 1$ as a waveband of a light for use in the film thickness distribution measurement by the reflection spectroscopy, wherein the film thickness distribution of the first thin film is measured by the reflection spectroscopy in a manner that a surface of the first wafer is irradiated with a light to selectively measure only reflected light at the selected waveband of reflected light from the surface of the first wafer, or in a manner that the surface of the first wafer is irradiated with a light at the selected waveband to measure all reflected lights of the reflected light from the surface of the first wafer.

Such a method can precisely measure the film thickness distribution of the first thin film at high density in a short time by the reflection spectroscopy with the light at the waveband that prevents the reflectance from varying due to variation in film thickness of the second thin film.

At this time, the waveband including the obtained wavelength $\lambda 1$ is preferably selected from a range of a wavelength $\lambda 1$ plus or minus 50 [nm].

In such a manner, it is possible to select more reliably the waveband that prevents the reflectance from varying due to variation in film thickness of the second thin film, and the film thickness distribution of the first thin film can be surely precisely measured.

Moreover, the present invention provides a method for measuring a film thickness distribution of a second thin film of a first wafer with thin films by reflection spectroscopy, the first wafer having a first thin film formed on a surface of a substrate and the second thin film formed on a surface of the first thin film, the method comprising: calculating a profile P1 by a simulation, the profile P1 indicating wavelength dependence of a reflectance of the first wafer with respect to a light at wavelengths not less than a wavelength region of visible light, the first wafer being an object to be measured; calculating a profile P22 by a simulation, the profile P22 indicating wavelength dependence of a reflectance of a second wafer with respect to a light at wavelengths not less than a wavelength region of visible light, the second wafer having thin films including a first thin film that is t [nm] thinner or thicker than a set film thickness T1 of the first thin film of the first wafer; calculating a profile P32 (=P22−P1) of a difference between the calculated profiles P1 and P22 and obtaining a wavelength $\lambda 2$ observed when the calculated profile P32 of the difference becomes zero; and selecting a waveband including the obtained wavelength $\lambda 2$ as a waveband of a light for use in the film thickness distribution measurement by the reflection spectroscopy, wherein the film thickness distribution of the first thin film is measured by the reflection spectroscopy in a manner that a surface of the first wafer is irradiated with a light to selectively measure only reflected light at the selected waveband of reflected light from the surface of the first wafer, or in a manner that the surface of the first wafer is irradiated with a light at the selected waveband to measure all reflected lights of the reflected light from the surface of the first wafer.

Such a method can precisely measure the film thickness distribution of the second thin film at high density in a short time by the reflection spectroscopy with the light at the waveband that prevents the reflectance from varying due to variation in film thickness of the first thin film.

At this time, the waveband including the obtained wavelength $\lambda 2$ is preferably selected from a range of a wavelength $\lambda 2$ plus or minus 50 [nm].

In such a manner, it is possible to select more reliably the waveband that prevents the reflectance from varying due to variation in film thickness of the first thin film, and the film thickness distribution of the second thin film can be surely precisely measured.

Furthermore, the present invention provides a method for measuring film thickness distributions of a first thin film and a second thin film of a first wafer with thin films by reflection spectroscopy, the first wafer having the first thin film formed on a surface of a substrate and the second thin film formed on a surface of the first thin film, the method comprising: calculating a profile P1 by a simulation, the profile P1 indicating wavelength dependence of a reflectance of the first wafer with respect to a light at wavelengths not less than a wavelength region of visible light, the first wafer being an object to be measured; calculating a profile P21 by a simulation, the profile P21 indicating wavelength dependence of a reflectance of a second wafer with respect to a light at wavelengths not less than a wavelength region of visible light, the second wafer having thin films including a second thin film that is t [nm] thinner or thicker than a set film thickness T2 of the second thin film of the first wafer; calculating a profile P31 (=P21−P1) of a difference between the calculated profiles P1 and P21 and obtaining a wavelength $\lambda 1$ observed when the calculated profile P31 of the difference becomes zero; calculating a profile P22 by a simulation, the profile P22 indicating wavelength dependence of a reflectance of a third wafer with respect to a light at wavelengths not less than a wavelength region of visible light, the third wafer having thin films including a first thin film that is t [nm] thinner or thicker than a set film thickness T1 of the first thin film of the first wafer; calculating a profile P32 (=P22−P1) of a difference between the calculated profiles P1 and P22 and obtaining a wavelength $\lambda 2$ observed when the calculated profile P32 of the difference becomes zero; and selecting a waveband including the obtained wavelengths $\lambda 1$ and $\lambda 2$ as a waveband of a light for use in the film thickness distribution measurement by the reflection spectroscopy, wherein the film thickness distributions of the first thin film and the second thin film are measured in a manner that a surface of the first wafer is irradiated with a light to selectively measure only reflected light at the selected waveband of reflected light from the surface of the first wafer, or in a manner that the surface of the first wafer is irradiated with a light at the selected waveband to measure all reflected lights of the reflected light from the surface of the first wafer.

Such a method can precisely measure the film thickness distributions of the first thin film and the second thin film at high density in a short time by the reflection spectroscopy with the light at the waveband that prevents the reflectance from varying due to variation in film thickness of the first and second thin films.

At this time, the waveband including the obtained wavelengths $\lambda 1$ and $\lambda 2$ is preferably selected, if $\lambda 1<\lambda 2$, from a range of a wavelength $\lambda 1$ minus 50 [nm] to a wavelength $\lambda 2$ plus 50 [nm] and the waveband is preferably selected, if $\lambda 1>\lambda 2$, from a range of a wavelength $\lambda 2$ minus 50 [nm] to a wavelength $\lambda 1$ plus 50 [nm].

In such a manner, it is possible to select more reliably the waveband that prevents the reflectance from varying due to variation in film thickness of the thin films, and the film thickness distributions of the first and second thin films can be surely precisely measured.

Moreover, at this time, the first wafer may be an SOI wafer, the first thin film may be a buried oxide film, and the second thin film may be an SOI layer composed of silicon single crystal.

The first wafer being measured may thus be an SOI wafer having a buried oxide film and an SOI layer. By selecting an appropriate wavelength in accordance with a combination of the film thickness of an SOI layer and of a buried oxide film, it is possible to precisely measure the film thickness distribution of a thin film of an SOI wafer at high density in a short time.

Advantageous Effects of Invention

In the present invention, since a waveband including a wavelength $\lambda 1$ observed when the above-described profile P31 of the difference becomes zero, a wavelength $\lambda 2$ observed when the profile P32 of the difference becomes zero, or both of these wavelengths is selected as the waveband of a light being measured in the film thickness distribution measurement by the reflection spectroscopy and a film thickness distribution is measured, it is possible to perform measurement by the reflection spectroscopy with a light at a waveband that prevents the reflectance from varying due to variation in film thickness of the first and second thin films and to precisely measure the film thickness distributions of the first thin film and the second thin film, alone or simultaneously, at high density in a short time. The fitting precision of film thickness can thereby be improved.

DESCRIPTION OF EMBODIMENTS

Hereinafter, embodiments of the present invention will be described, but the present invention is not limited to this embodiment.

Conventionally, performing measurement at high density, with a high degree of precision, and in a short time in a method for measuring film thickness distribution that measures the film thickness distribution of a wafer with a two-layered thin film, such as an SOI wafer, by reflection spectroscopy has become a challenge.

Accordingly, the inventor of the present invention conducted a great deal of study to solve such a problem. As a result, the inventor of the present invention has found that a wavelength at which a reflectance of an emitted light is substantially invariable exists with respect to the respective first and second thin films, even when the first thin film and the second thin film have variation in their thicknesses, and such a wavelength differs depending on the specification of set film thickness of thin films of a wafer. In addition, the inventor of the present invention has found out that, by performing measurement by the reflection spectroscopy with a light at a waveband in a predetermined range about this wavelength, it is possible to perform practically high-throughput and high-precision measurement of a film thickness distribution and to improve the fitting precision of a film thickness, bringing the present invention to completion.

Figure 1:
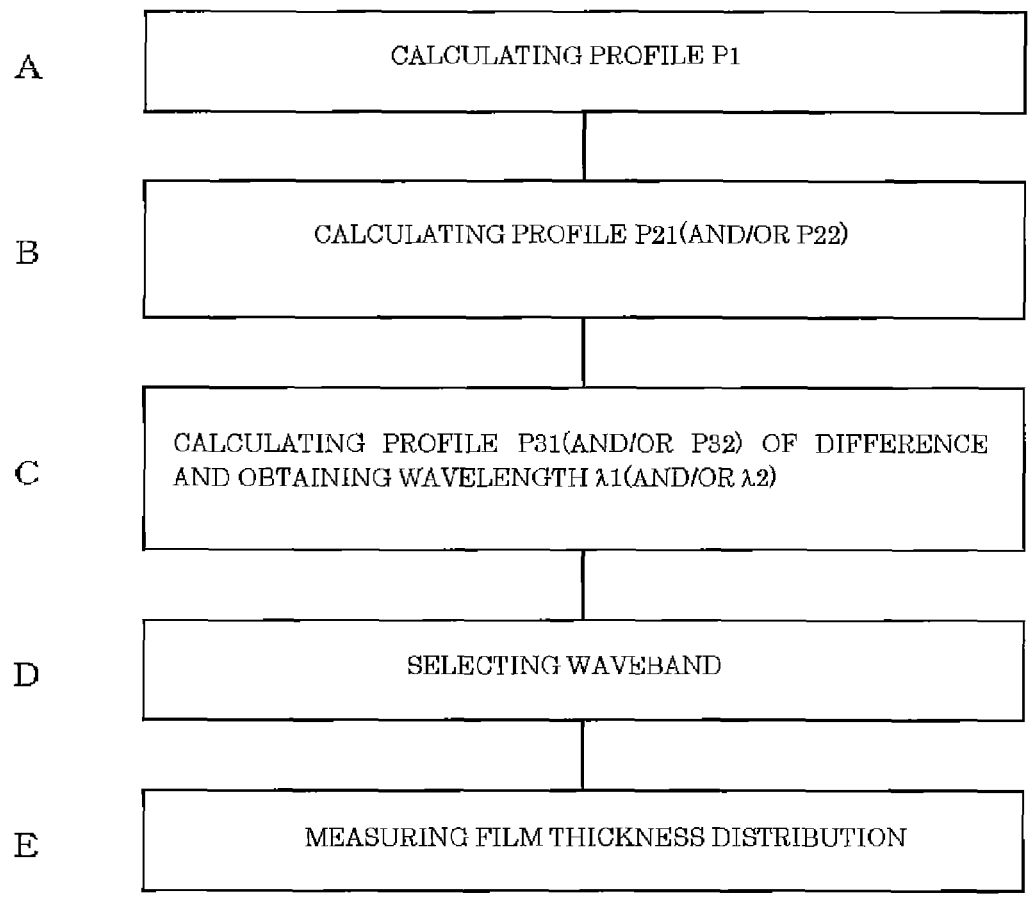
FIG. 1 is a flow diagram of the processes of a method for measuring a film thickness distribution of the present invention.

FIG. 1 is a flow diagram of the processes of a method for measuring a film thickness distribution of the present invention.

An object to be measured of the method for measuring a film thickness distribution of the present invention is a wafer with a thin film including a first thin film formed on the surface of a substrate and a second thin film formed on the surface of the first thin film. For example, examples of the wafer include an SOI wafer having a buried oxide film (a BOX film) formed on a silicon substrate and an SOI layer, composed of silicon single crystal, formed thereon. Here, descriptions are given by taking up a case in which the wafer with thin films is such an SOI wafer by way of example.

Here, it is assumed that the set film thickness of the buried oxide film and the set film thickness of the SOI layer, which are set at the time of production of the SOI wafer, are T1 [nm] and T2 [nm], respectively.

In the method for measuring film thickness distribution of the present invention, a waveband that prevents the reflectance from varying due to variation in film thickness of thin films of the SOI wafer being measured is selected and a light at the selected waveband is analyzed at the time of the film thickness distribution measurement by the reflection spectroscopy. The processes described below are performed to select this waveband. Firstly, a case in which only the film thickness distribution of the first thin film, that is, the buried oxide film is measured will be described.

A profile P1, which indicates wavelength dependence of a reflectance of the SOI wafer being measured with respect to a light at wavelengths not less than a wavelength region of visible light, is calculated by a simulation (refer to FIG. 1 at 'A').

A profile P21, which indicates wavelength dependence of a reflectance of an SOI wafer having an SOI layer that is t [nm] thinner or thicker than a set film thickness T2 of the second thin film, that is, the SOI layer of the SOI wafer being measured with respect to a light at wavelengths not less than a wavelength region of visible light, is calculated by a simulation (refer to FIG. 1 at 'B'). Here, the value of t is not limited to a particular value, and may be about 1 nm, for example.

Figure 3A:
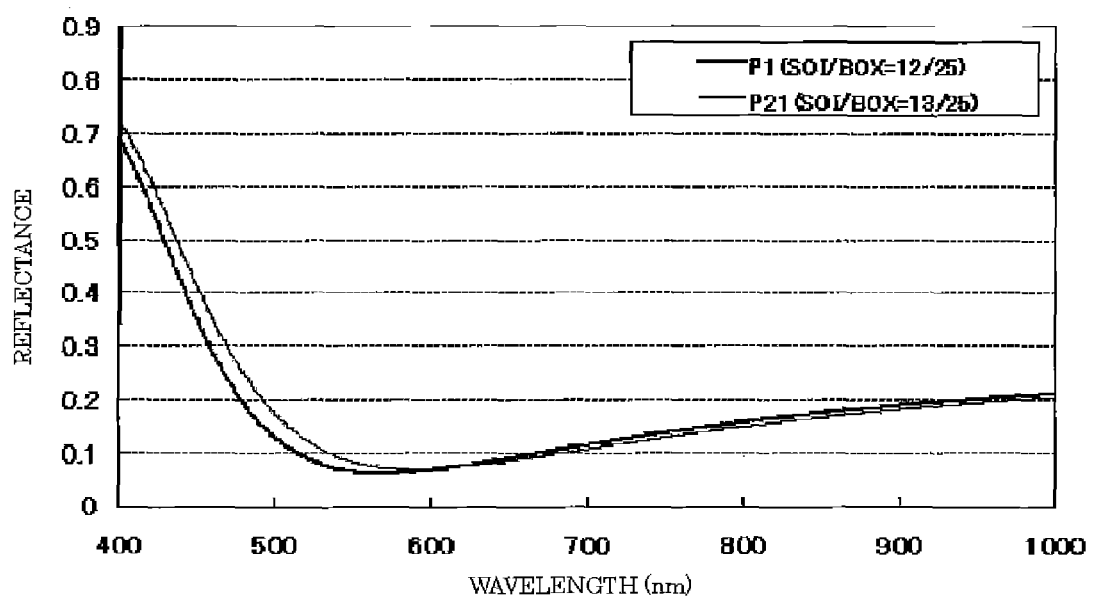
FIGS. 3A to 3C depict the respective profiles calculated in Examples 1 to 3.

FIG. 3A is a diagram depicting an example of the profile P1 when the set film thickness T2 of the SOI layer and the set film thickness T1 of the buried oxide film of the SOI wafer being measured are 12 nm and 25 nm, respectively, and an example of the profile P21 of an SOI wafer whose the SOI layer is 1 nm thicker than the SOI layer of the SOI wafer being measured, that is, the profile P21 of an SOI wafer whose the set film thickness T2 of the SOI layer is 13 nm and the set film thickness T1 of the buried oxide film is 25 nm.

As depicted in FIG. 3A, by changing the thickness of the SOI layer, the profiles P1 and P21 indicating the wavelength dependence of reflectance vary.

A profile P31 (=P21−P1) of a difference between the profiles P1 and P21 calculated by the simulations is then calculated, and a wavelength λ1 observed when the calculated profile P31 of the difference becomes zero is obtained (refer to FIG. 1 at 'C'). Here, the profile P31 is a profile indicating the wavelength dependence of a reflectance differential between P1 and P21.

Figure 3B:
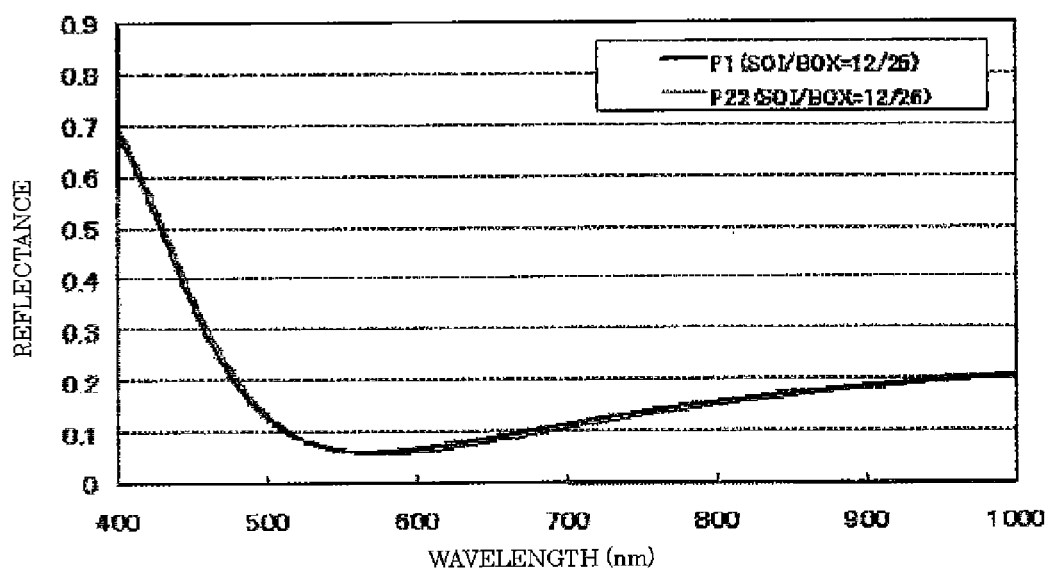
Figure 3C:
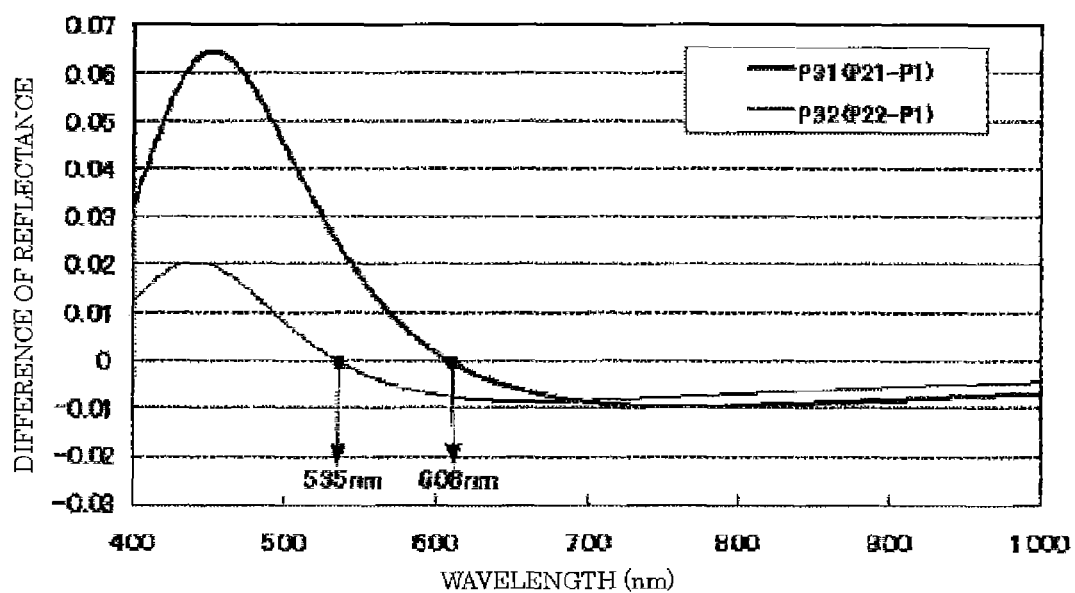
Figure 4A:
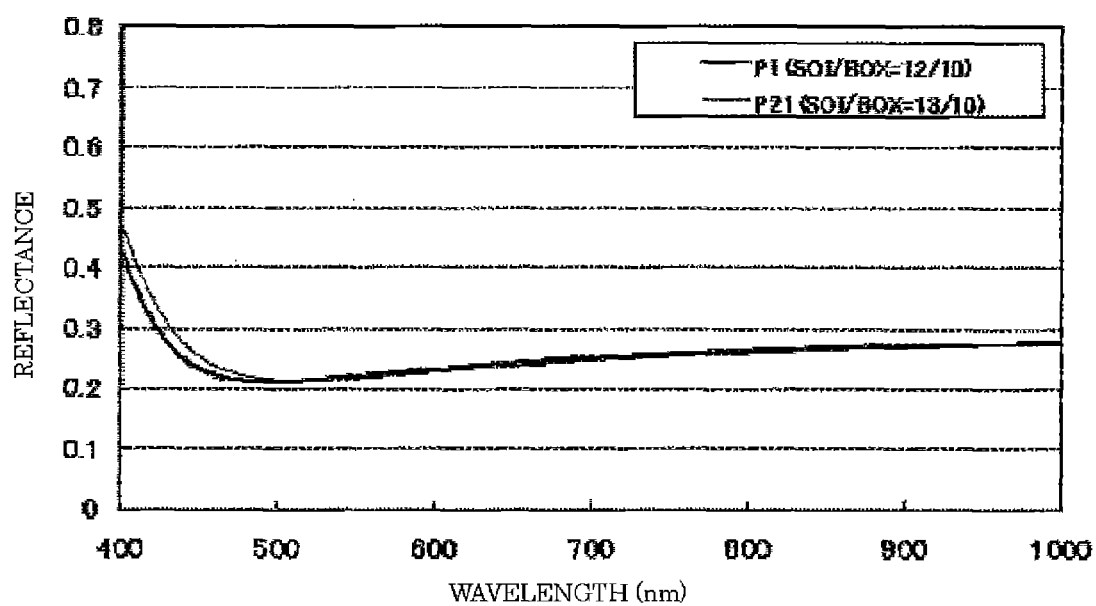
FIGS. 4A to 4C depict an example of the respective profiles calculated for an SOI wafer.
Figure 4B:
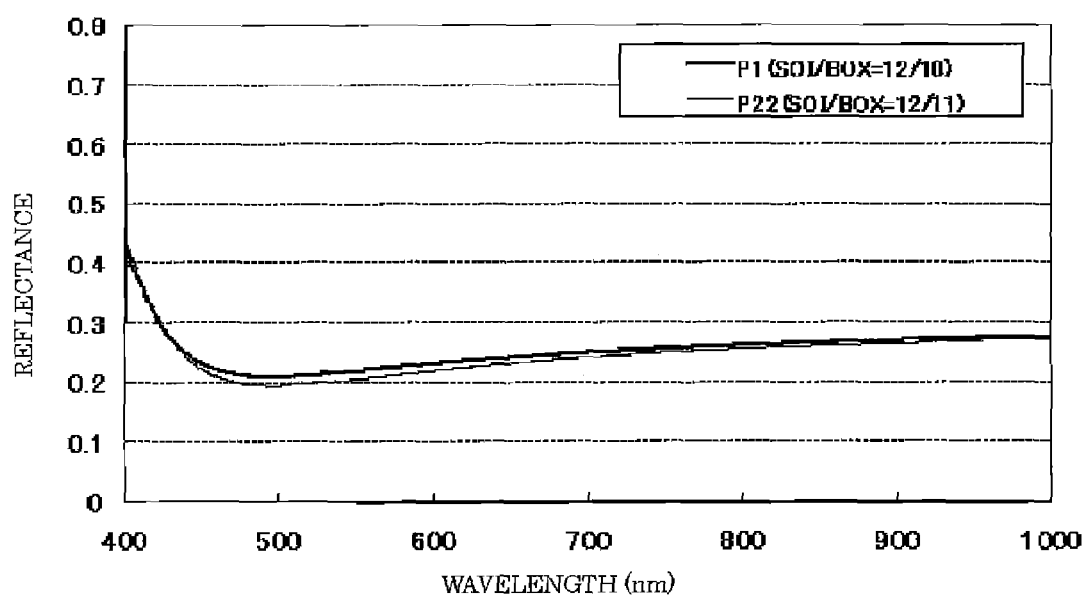
Figure 4C:
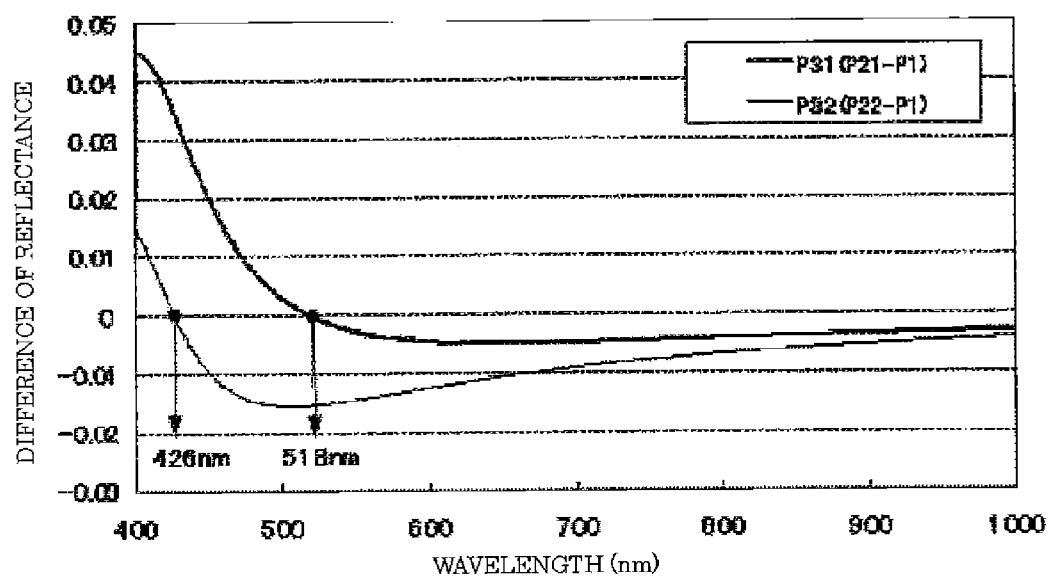
Figure 5A:
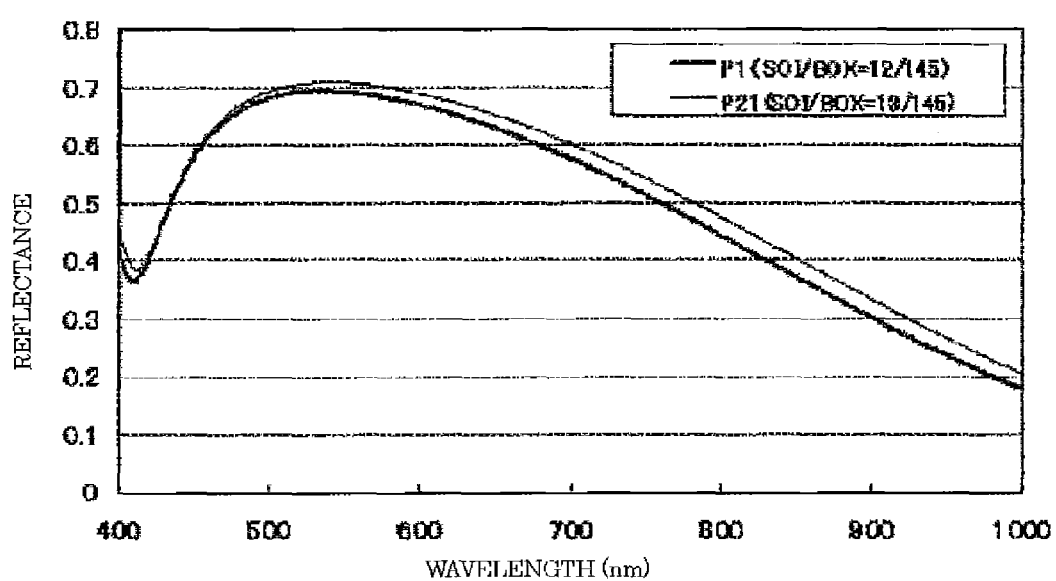
FIGS. 5A to 5C depict an example of the respective profiles calculated for an SOI wafer.
Figure 5B:
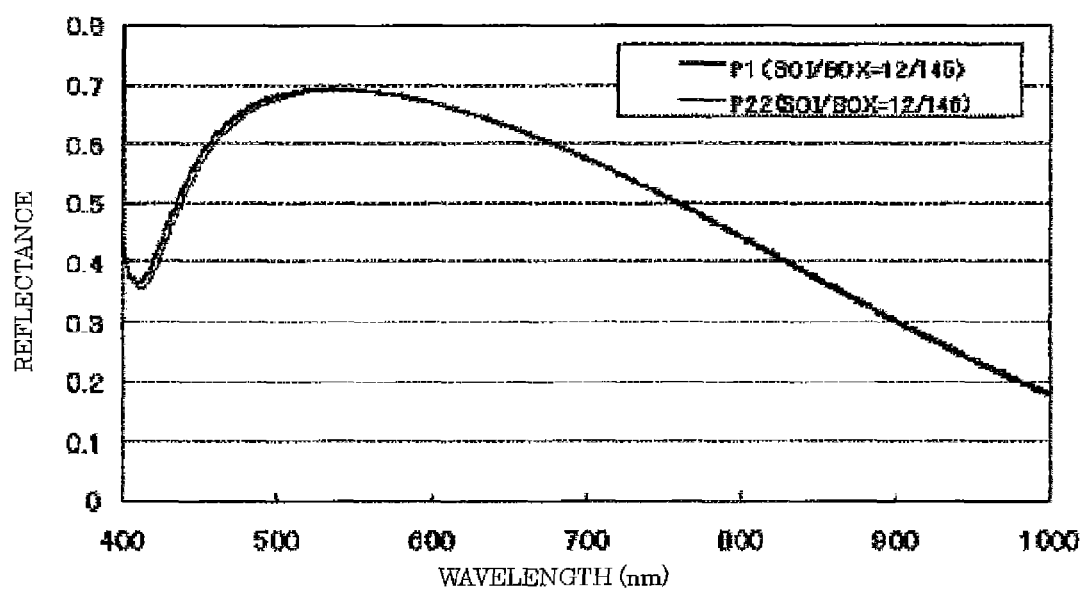
Figure 5C:
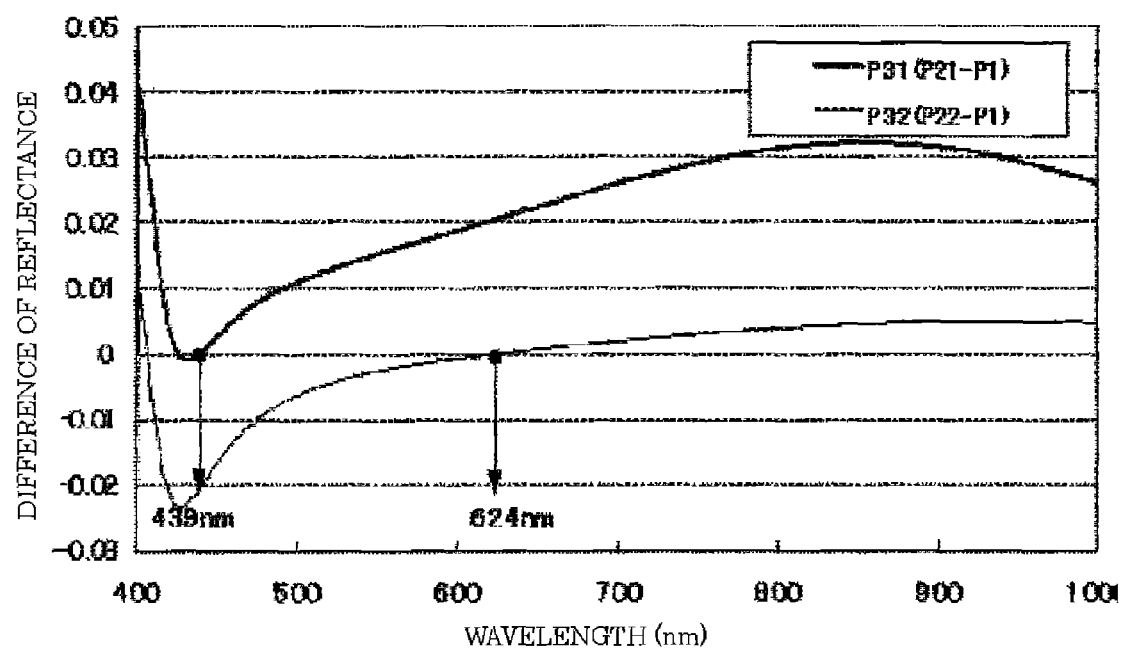
Figure 6A:
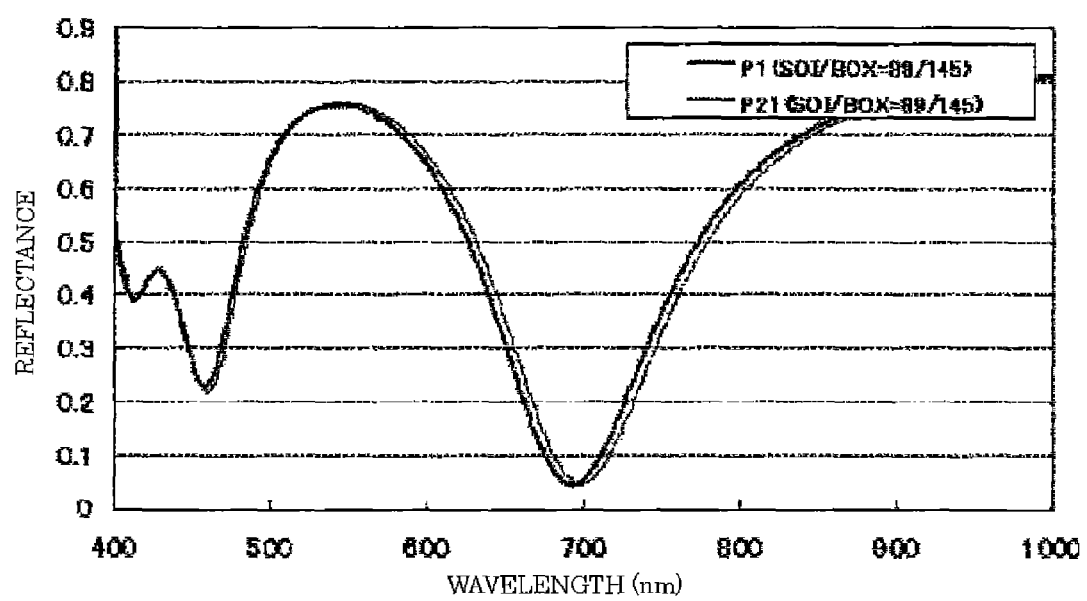
FIGS. 6A to 6C depict an example of the respective profiles calculated for an SOI wafer.
Figure 6B:
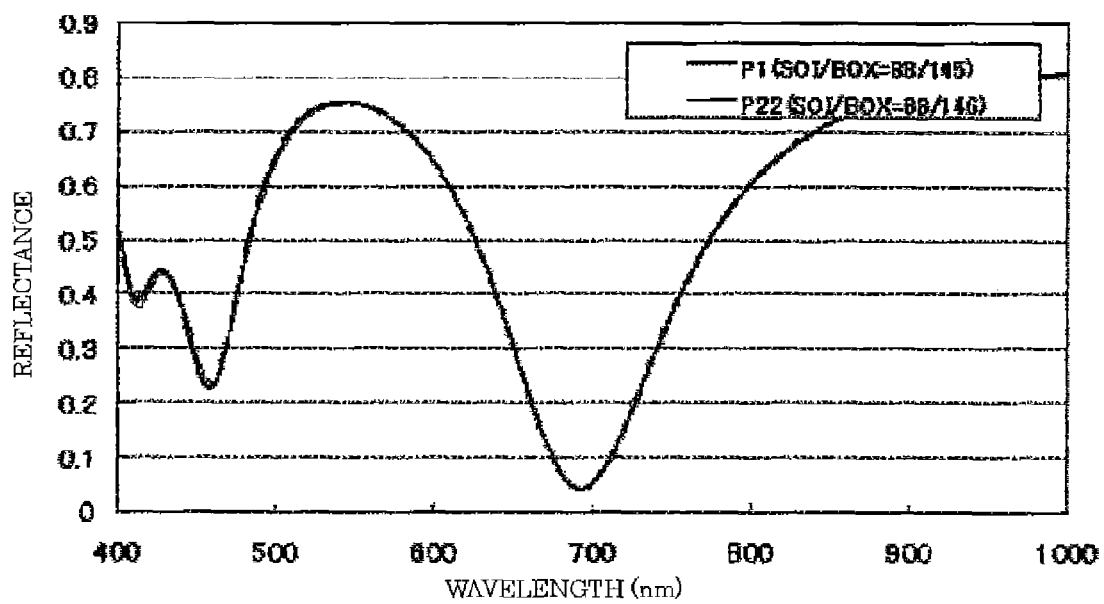
Figure 6C:
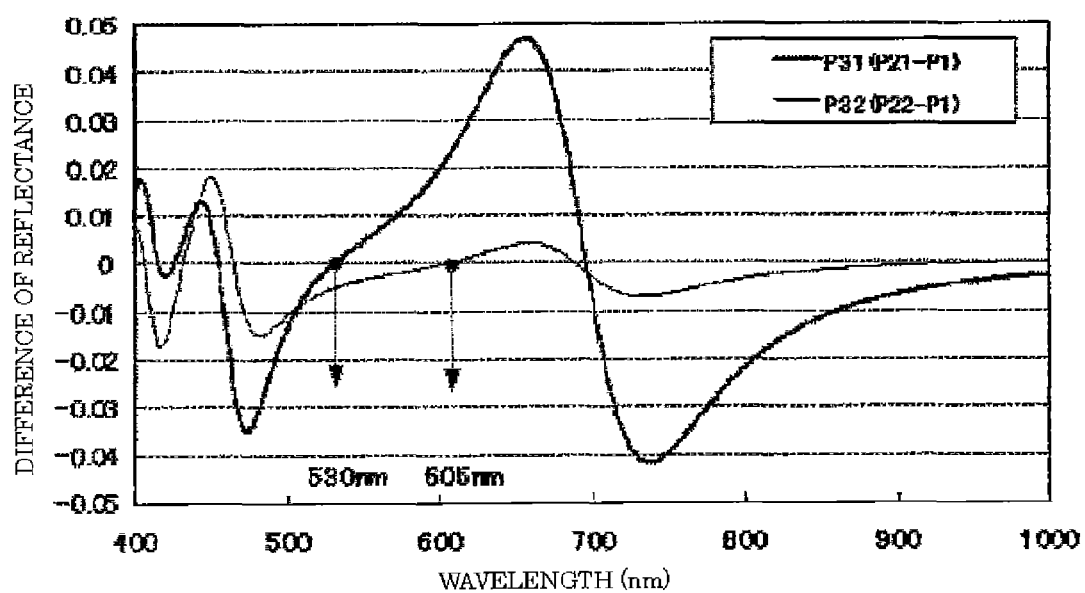

In FIG. 3C, the profile P31 of the difference between the profiles P1 and P21 depicted in FIG. 3A is depicted. As depicted in FIG. 3C, the wavelength λ1 observed when the profile P31 in this case becomes zero, that is, when the reflectance differential becomes zero is 608 nm.

Figure 7A:
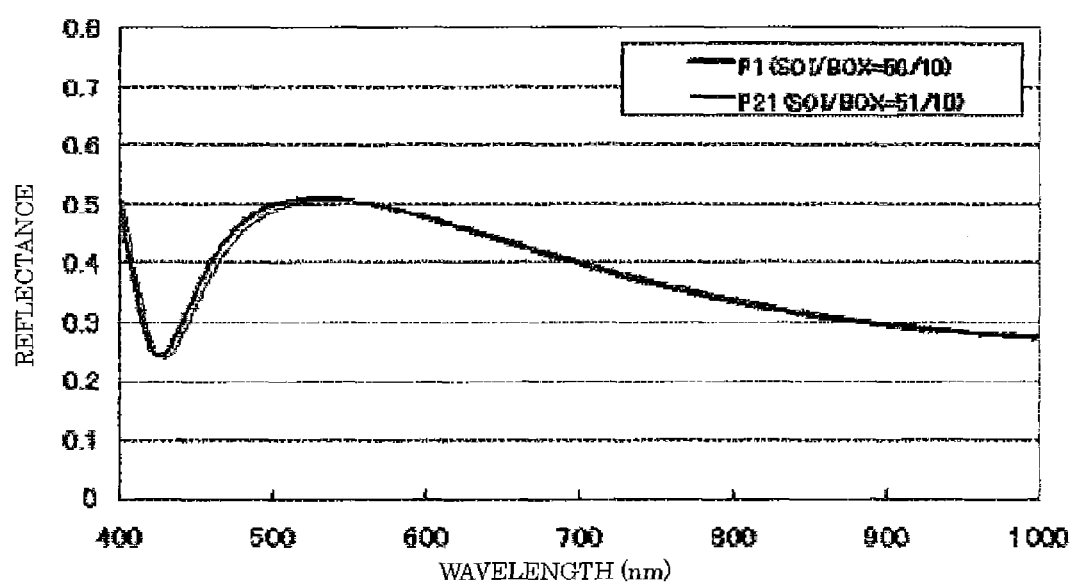
FIGS. 7A to 7C depict an example of the respective profiles calculated for an SOI wafer.
Figure 7B:
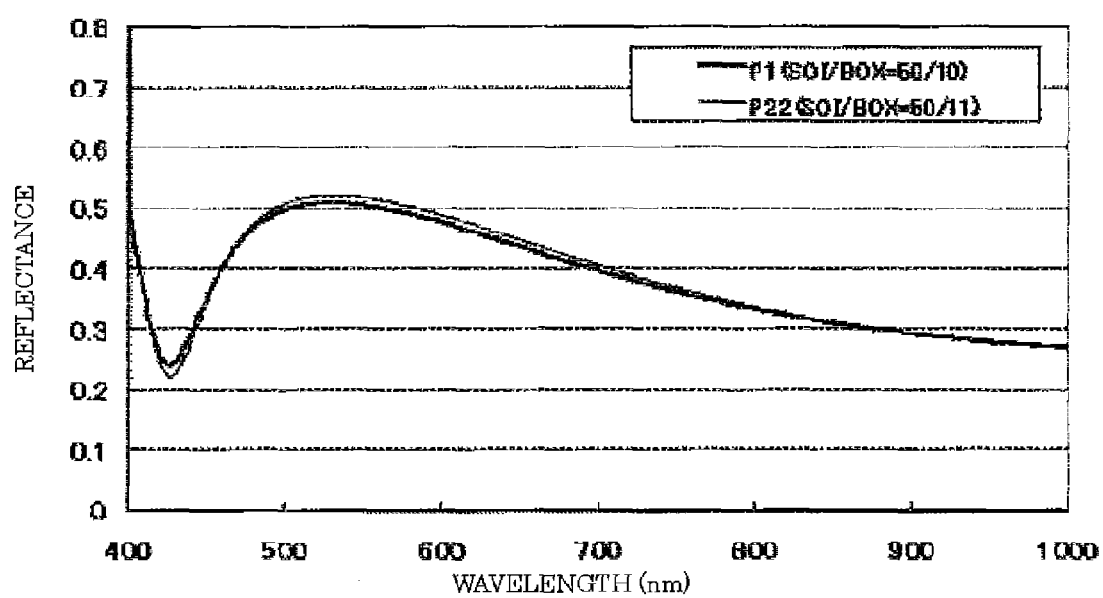
Figure 7C:
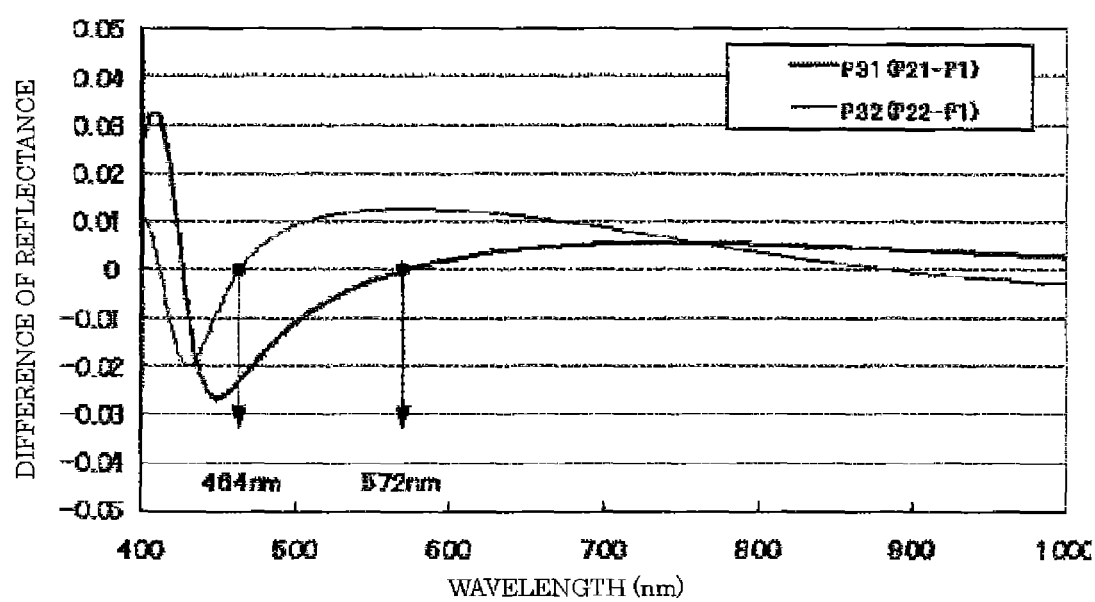

In each of FIG. 40 to FIG. 7C, the profile P31 of a difference for an SOI wafer having an SOI layer and a buried oxide film whose set film thicknesses are different from those of FIG. 3C is depicted, and, in this case, if there are a plurality of wavelengths observed when the profile P31 becomes zero, as a wavelength λ1 to be obtained, a wavelength at which an S/N ratio of a detection system of an apparatus used in the film thickness distribution measurement can be increased is used. In general, by adopting a wavelength closer to 500 to 700 nm, it becomes possible to perform high-sensitivity measurement.

A waveband including the obtained wavelength λ1 is then selected as the waveband of a light for use in the film thickness distribution measurement by the reflection spectroscopy (refer to FIG. 1 at 'D').

Here, it is preferable that the waveband is selected from a range of a wavelength λ1 plus or minus 50 nm. By doing so, it is possible to select more reliably a waveband that prevents the reflectance from varying due to variation in film thickness of the thin film.

In the example of the profile P31 depicted in FIG. 3C, a waveband including 608 nm is selected from a range (558 to 658 nm) of a wavelength of 608 nm plus or minus 50 nm.

In the method for measuring a film thickness distribution of the present invention, there is no need to perform this selection of a waveband each time, and it is possible to select an appropriate waveband in advance by the above-described processes in accordance with a combination of an SOI layer thickness and a buried oxide film thickness of a wafer with thin films being measured. By selecting a waveband in advance in this manner, it is possible to shorten the time of the film thickness distribution measurement.

The film thickness distribution of the buried oxide film is then measured by the reflection spectroscopy with the waveband selected in this manner (refer to FIG. 1 at 'E') as follows:

The film thickness distribution of the buried oxide film is measured in such a manner that the surface of the SOI wafer being measured is irradiated with a light to selectively measure only reflected light at the selected waveband of reflected light from the surface of the SOI wafer. At this time, the waveband of the light with which the surface of the SOI wafer is irradiated may be a wide waveband of visible light. Use of analysis software allows the selective measurement of the reflected light at the selected waveband of the reflected light from the surface of the SOI wafer. This method eliminates the need to use a complicated measurement method and apparatus, is easy to be performed, and is highly practical.

Alternatively, the film thickness distribution of the buried oxide film may be measured in a manner that the surface of the SOI wafer being measured is irradiated with a light at the selected waveband to measure all reflected lights of the reflected light from the surface of the SOI wafer. As a method for irradiating the surface of the SOI wafer with the light at the selected waveband, irradiation can be performed by using an optical microscope unit depicted in FIG. 2, for example.

Figure 2:
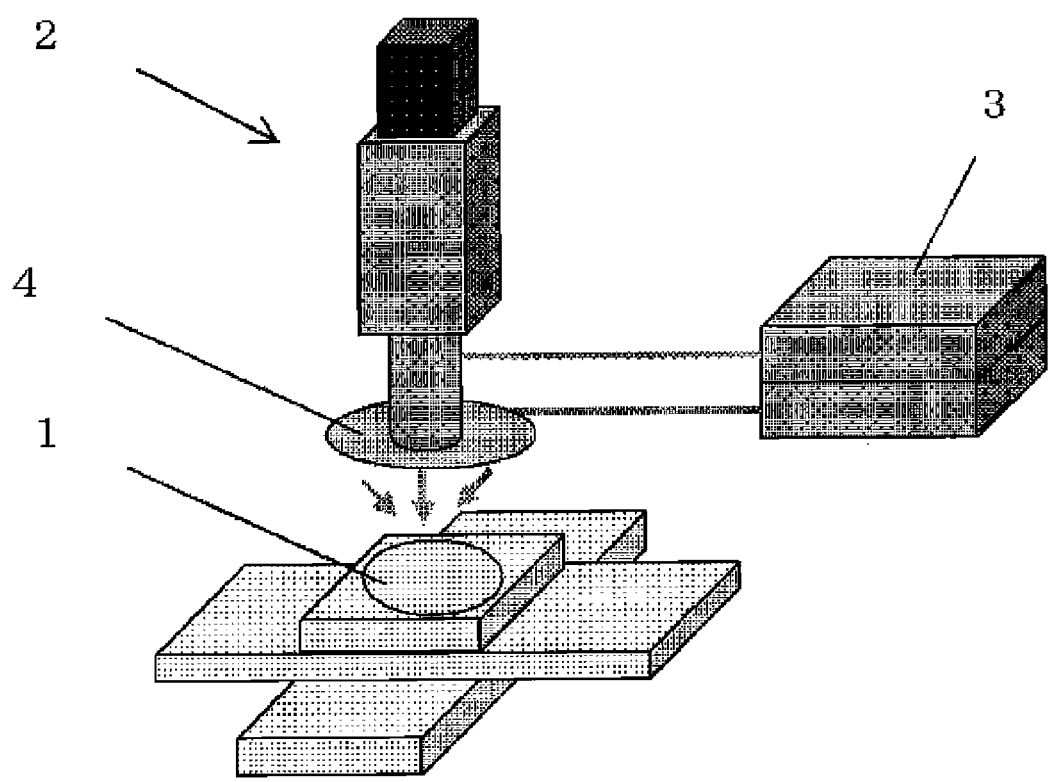
FIG. 2 is a schematic diagram depicting an optical inspection apparatus that can be used in the method for measuring a film thickness distribution of the present invention.

To an optical microscope unit 2 depicted in FIG. 2, a band-pass filter 4 is attached, and the light at the selected waveband of lights emitted from a light source 3 alone can filter through the band-pass filter 4 to irradiate the surface of an SOI wafer 1. By doing so, the precision of the film thickness distribution measurement can be further increased.

Alternatively, it is also possible to perform filtering of a light with which the surface is irradiated by changing the band-pass filter 4 to an acoustic filter, a liquid crystal filter, or a wavelength-variable laser, for example.

Moreover, it is also possible to set a waveband by a light source and use various lasers (an LD, a gas laser, a solid-state laser, and a wavelength-variable laser), a light-emitting diode (LED), a liquid crystal display device (LCD), and so forth. Moreover, as a simplified way, it is also possible to use one signal of RGB signals of a color camera.

From an intensity distribution of the reflected light, measured in the manner described above, the film thickness distribution of the first thin film can be obtained.

Secondary, a case in which only the film thickness distribution of the second thin film, that is, the SOI layer is measured will be described. The matters that will not be described below are basically the same as those of the above-described case in which the film thickness distribution of the buried oxide film is measured.

After the profile P1 is calculated in a manner similar to that described above (refer to FIG. 1 at 'A'), a profile P22, which indicates wavelength dependence of a reflectance of a SOI wafer having a buried oxide film that is t [nm] thinner or thicker than a set film thickness T1 of the buried oxide film of the SOI wafer being measured with respect to a light at wavelengths not less than a wavelength region of visible light, is calculated by a simulation (refer to FIG. 1 at 'B').

FIG. 3B is a diagram depicting an example of the profile P1 when the set film thickness T2 of the SOI layer and the set film thickness T1 of the buried oxide film of the SOI wafer being measured are 12 nm and 25 nm, respectively, and an example of the profile P22 of an SOI wafer whose the buried oxide film is 1 nm thicker than the buried oxide film of the SOI wafer being measured, that is, the profile P22 of an SOI wafer whose the set film thickness T1 of the buried oxide film is 26 nm and the set film thickness T2 of the SOI layer 12 nm.

A profile P32 (=P22−P1) of a difference between the profiles P1 and P22 calculated by the simulations is then calculated, and a wavelength λ2 observed when the calculated profile P32 of the difference becomes zero is obtained (refer to FIG. 1 at 'C').

In FIG. 3C, the profile P32 of the difference between the profiles P1 and P22 depicted in FIG. 3B is depicted. As depicted in FIG. 3C, the wavelength λ2 observed when the profile P32 in this case becomes zero, that is, when the reflectance differential becomes zero is 535 nm.

A waveband including the obtained wavelength λ2 is then selected as the waveband of a light for use in the film thickness distribution measurement by the reflection spectroscopy (refer to FIG. 1 at 'D'). Here, it is preferable that the waveband is selected from a range of a wavelength λ2 plus or minus 50 nm. By doing so, it is possible to select more reliably a waveband that prevents the reflectance from varying due to variation in film thickness of the thin film.

In the example of the profile P32 depicted in FIG. 3C, a waveband including 535 nm is selected from a range (485 to 585 nm) of a wavelength of 535 nm plus or minus 50 nm. The film thickness distribution of the SOI layer is then measured by the reflection spectroscopy with the selected waveband (refer to FIG. 1 at 'E').

Finally, when the film thickness distributions of the first thin film and the second thin film are measured at the same time, the profiles P1, P21, P22, P31, and P32 are calculated and the wavelengths λ1 and λ2 are obtained in a manner similar to that described above.

In the examples depicted in FIGS. 3A and 3B, λ1 is 608 nm and λ2 is 535 nm.

A waveband including the obtained wavelengths λ1 and λ2 is then selected as the waveband of a light for use in the film thickness distribution measurement by the reflection spectroscopy. If the obtained wavelength λ1 is less than the obtained wavelength λ2 (λ1<λ2), then the waveband is preferably selected from a range of a wavelength λ1 minus 50 nm to a wavelength λ2 plus 50 nm. If the obtained wavelength λ1 is more than the obtained wavelength λ2 (λ1>λ2), then the waveband is preferably selected from a range of a wavelength λ2 minus 50 nm to a wavelength λ1 plus 50 nm. By doing so, it is possible to select more reliably a waveband that prevents the reflectance from varying due to variation in film thickness of the thin film.

In the example depicted in FIG. 3C, the wavelength λ1 is more than the wavelength λ2, and a waveband including 535 nm and 608 nm is selected from a range (485 to 658 nm) of a wavelength of 535 nm minus 50 nm to a wavelength of 608 nm plus 50 nm. In an exemplary case of selecting a waveband of 535 to 608 nm at this time, the measurement precision can be improved because the reflectance changes due to an increase in the SOI film thickness in a manner opposite to a change in reflectance due to an increase in the buried oxide film.

Then, by using the selected waveband, the film thickness distribution of the buried oxide film is measured by the reflection spectroscopy.

With the above-described method for measuring film thickness distribution of the present invention, when a wafer with thin films, which is an object to be measured, is irradiated with a light, even when the first thin film and the second thin film suffer film thickness fluctuations, since film thickness distribution measurement can be performed by reflection spectroscopy by using a light at a waveband that prevents the reflectance from varying, it is possible to precisely measure the film thickness distributions of the first thin film and the second thin film at high density in a short time.

Figure 8A:
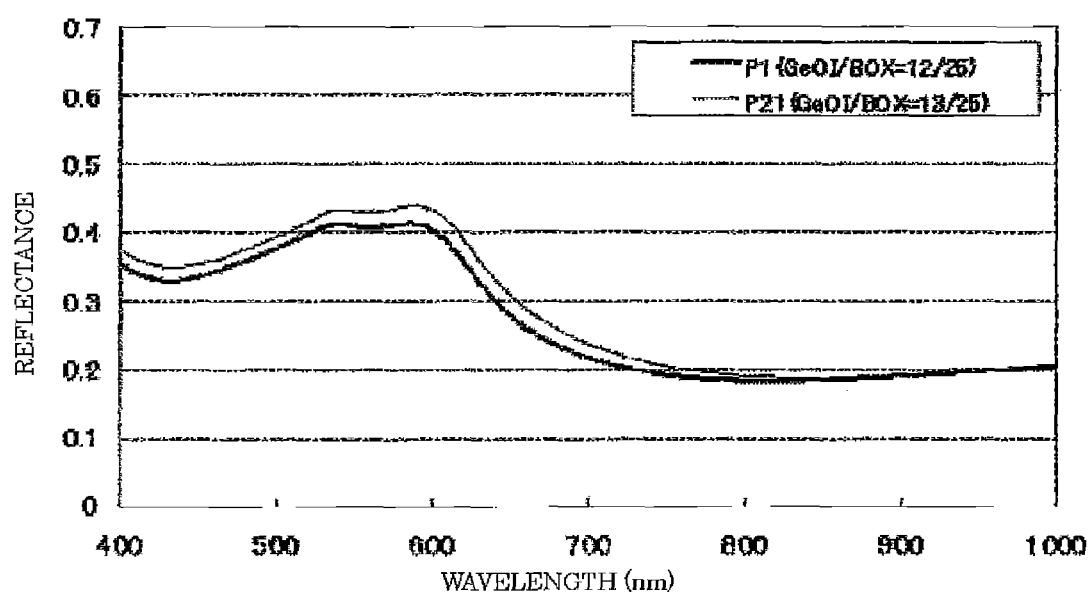
FIGS. 8A to 8C depict an example of the respective profiles calculated for a GeOI wafer.
Figure 8B:
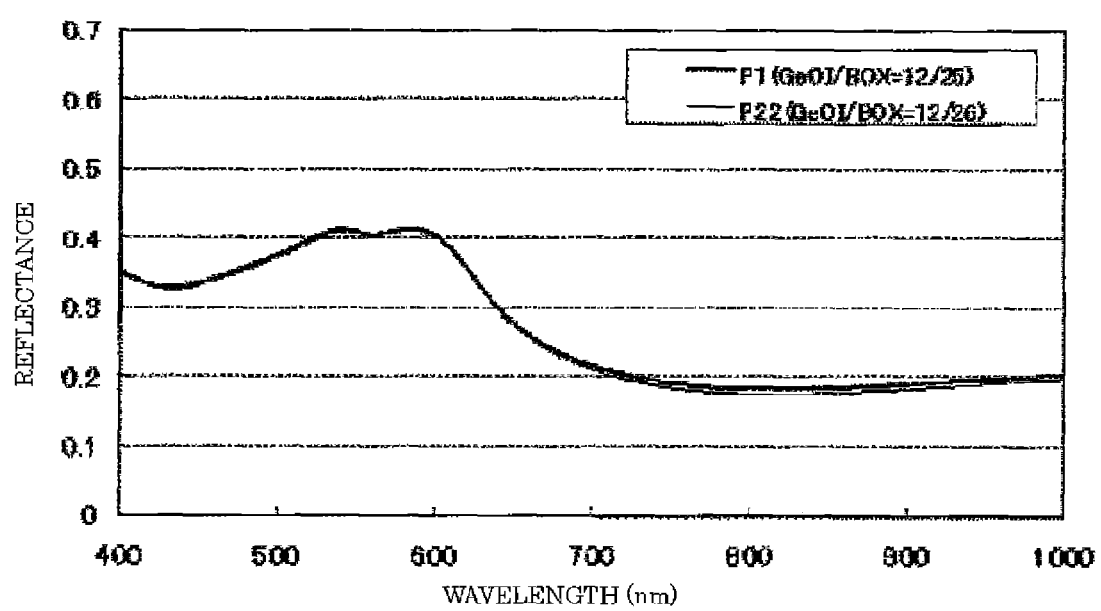
Figure 8C:
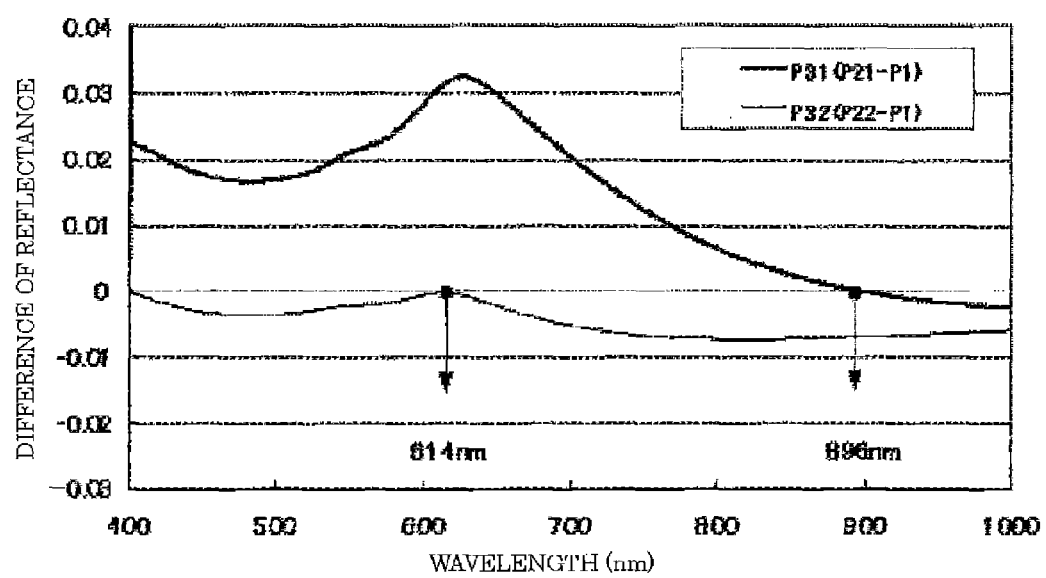

In FIGS. 4 to 7, examples of the profiles P1, P21, P22, P31, and P32 calculated by simulations for SOI wafers with other set film thickness specifications are depicted. In FIG. 8, examples of the profiles P1, P21, P22, P31, and P32 calculated by simulations in a GeOI wafer in which the first thin film is a buried oxide film and the second thin film is a GeOI (Germanium On Insulator) layer are depicted. In Table 1, the set film thickness specifications of these wafers are listed.

TABLE 1

|  | FIRST THIN FILM | | SECOND THIN FILM | |
| --- | --- | --- | --- | --- |
|  | MATERIAL | SET FILM THICKNESS | MATERIAL | SET FILM THICKNESS |
| WAFER1 (FIG. 3) | $SiO_2$(BOX) | 25 nm | Si(SOI) | 12 nm |
| WAFER2 (FIG. 4) | $SiO_2$(BOX) | 10 nm | Si(SOI) | 12 nm |
| WAFER3 (FIG. 5) | $SiO_2$(BOX) | 145 nm | Si(SOI) | 12 nm |
| WAFER4 (FIG. 6) | $SiO_2$(BOX) | 145 nm | Si(SOI) | 88 nm |
| WAFER5 (FIG. 7) | $SiO_2$(BOX) | 10 nm | Si(SOI) | 50 nm |
| WAFER6 (FIG. 8) | $SiO_2$(BOX) | 25 nm | Ge(GeOI) | 12 nm |

As depicted the figures, for each of the wafers with thin films of various specifications of the set film thickness, a wavelength observed when the profiles P31 and P32 of a difference become zero exists. As described earlier, when the wafer with thin films is irradiated with a light at this wavelength, the reflectance of the light does not vary. Accordingly, by performing measurement by the reflection spectroscopy with a light at a waveband in a predetermined range about this wavelength, it is possible to perform practically high-throughput and high-precision measurement of a film thickness distribution.

Therefore, it is possible to perform process management and quality management of a wafer having an SOI and BOX layers having highly uniform film thickness distribution, which is required for an FD-SOI device and so forth.

EXAMPLES

Hereinafter, the present invention will be described more specifically with reference to examples and comparative examples of the present invention, but the present invention is not limited to these examples.

Example 1

The film thickness distribution of the buried oxide film (a BOX layer) of a 300-mm-diameter SOI wafer was measured by the inventive method depicted in FIG. 1 to evaluate the fitting precision.

Here, the SOI wafer, an object to be measured, included an SOI layer having a set film thickness of 12 nm and a buried oxide film having a set film thickness of 25 nm. The conditions of the film thickness distribution measurement by the reflection spectroscopy included measurement points on the entire wafer surface at intervals of 1 mm except for a peripheral region of 3 mm. Incidentally, fitting precision is measurement precision based on a 95% confidence interval.

Profiles P1, P21, and P31 were calculated to select a waveband used for the film thickness distribution measurement by the reflection spectroscopy. In the calculation of P21, the condition of t was that the thickness was increased by 1 nm (the set film thickness of the SOI layer was 13 nm.) The calculated P1 and P21 are depicted in FIG. 3A and the calculated P31 is depicted in FIG. 3C. The wavelength $\lambda 1$ observed when the profile P31 became zero was 608 nm and the selected waveband including the wavelength $\lambda 1$ was a waveband of 598 to 618 nm.

The film thickness distribution of the buried oxide film was then measured by the reflection spectroscopy in a manner that the SOI wafer being measured was irradiated with a visible light at a 400- to 800-nm waveband and only reflected light at the selected waveband was selectively measured.

The results are listed in Table 2. As listed in Table 2, the fitting precision was improved greatly as compared to the later-described Comparative Example 1, and the precision was greater or equal to that of spectroscopic ellipsometry (a precision of 0.11 nm or less at the maximum). Moreover, the time required for the measurement was 1 minute or less, which was equal to the time required for normal reflection spectroscopy.

Example 2

The film thickness distribution of the SOI layer of an SOI wafer having the same conditions as those of Example 1 was measured by the inventive method depicted in FIG. 1 to evaluate the fitting precision.

Profiles P1, P22, and P32 were calculated to select a waveband used for the film thickness distribution measurement by the reflection spectroscopy. In the calculation of P22, the condition of t was that the thickness was increased by 1 nm (the set film thickness of the buried oxide film was 26 nm.) The calculated P1 is depicted in FIG. 3A, the calculated P22 is depicted in FIG. 3B, and the calculated P32 is depicted in FIG. 3C. The wavelength $\lambda 2$ observed when the profile P32 became zero was 535 nm and the selected waveband including the wavelength $\lambda 2$ was a waveband of 525 to 545 nm.

The film thickness distribution of the buried oxide film was then measured by the reflection spectroscopy in a manner that the SOI wafer being measured was irradiated with a visible light at a 400 to 800 nm waveband and only reflected light at the selected waveband was selectively measured. Other conditions were the same as those of Example 1.

The results are listed in Table 2. As listed in Table 2, the fitting precision was improved greatly as compared to the later-described Comparative Example 2, and the precision was greater or equal to that of spectroscopic ellipsometry (a precision of 0.11 nm or less at the maximum). Moreover, the time required for the measurement was 1 minute or less, which was equal to the time required for normal reflection spectroscopy.

Example 3

The film thickness distribution of the SOI layer and the buried oxide film of an SOI wafer having the same conditions as those of Example 1 was measured by the inventive method depicted in FIG. 1 to evaluate the fitting precision.

Profiles P1, P21, P22, P31 and P32 were calculated to select a waveband used for the film thickness distribution measurement by the reflection spectroscopy. In the calculation of P21, the condition of t was that the thickness was increased by 1 nm (the set film thickness of the SOI layer was 13 nm.) In the calculation of P22, the condition of t was that the thickness was increased by 1 nm (the set film thickness of the buried oxide film was 26 nm.) The calculated P1 and P21 are depicted in FIG. 3A, the calculated P22 is depicted in FIG. 3B, and the calculated P31 and P32 are depicted in FIG. 3C. The wavelengths $\lambda 1$ and $\lambda 2$ observed when the profiles P31 and P32 became zero were 608 nm and 535 nm, respectively, and the selected waveband including the wavelengths $\lambda 1$ and $\lambda 2$ was a waveband of 535 to 610 nm.

The film thickness distribution of the buried oxide film was then measured by the reflection spectroscopy in a manner that the SOI wafer being measured was irradiated with a visible light at a 400- to 800-nm waveband and only reflected light at the selected waveband was selectively measured. Other conditions were the same as those of Example 1.

The results are listed in Table 2. As listed in Table 2, the fitting precision was improved greatly as compared to the later-described Comparative Example 3, and the precision was greater or equal to that of spectroscopic ellipsometry (a precision of 0.11 nm or less at the maximum). Moreover, the time required for the measurement was 1 minute or less, which was equal to the time required for normal reflection spectroscopy.

Performing measurement by spectroscopic ellipsometry at the same measurement points as those of Examples 1 to 3 is impractical because it takes 30 hours or more, even if one point is measured under a poor measurement precision, e.g., for 2 seconds.

Comparative Example 1

The film thickness distribution of the buried oxide film of an SOI wafer was measured under the same conditions as those of Example 1 except that a visible light in a 400- to 800-nm waveband was emitted and all reflected lights at the waveband at the time of the film thickness distribution measurement by the reflection spectroscopy, and evaluation was performed in a manner similar to that of Example 1.

The results are listed in Table 2. As listed in Table 2, the fitting precision was greatly worse than that of Example 1.

Comparative Example 2

The film thickness distribution of the SOI layer of an SOI wafer was measured under the same conditions as those of Example 2 except that a visible light in a 400 to 800 nm waveband was emitted and all reflected lights at the waveband at the time of the film thickness distribution measurement by the reflection spectroscopy, and evaluation was performed in a manner similar to that of Example 2.

The results are listed in Table 2. As listed in Table 2, the fitting precision was greatly worse than that of Example 2.

Comparative Example 3

The film thickness distribution of the SOI layer and the buried oxide film of an SOI wafer was measured under the same conditions as those of Example 3 except that a visible light in a 400 to 800 nm waveband was emitted and all reflected lights at the waveband at the time of the film thickness distribution measurement by the reflection spectroscopy, and evaluation was performed in a manner similar to that of Example 3.

The results are listed in Table 2. As listed in Table 2, the fitting precision was greatly worse than that of Example 3.

TABLE 2

|  |  | MIN (nm) | MAX (nm) | AVERAGE (nm) | STANDARD DEVIATION (nm) |
|---|---|---|---|---|---|
| EXAMPLE1 | BOX LAYER THICKNESS | 23.803 | 26.687 | 24.682 | 0.164 |
|  | FITTING PRECISION | 0.024 | 0.109 | 0.065 | 0.012 |
| EXAMPLE2 | SOI LAYER THICKNESS | 11.203 | 12.542 | 12.074 | 0.161 |
|  | FITTING PRECISION | 0.012 | 0.072 | 0.033 | 0.007 |
| EXAMPLE3 | SOI LAYER THICKNESS | 11.369 | 12.537 | 12.071 | 0.170 |
|  | FITTING PRECISION, SOI LAYER THICKNESS | 0.024 | 0.072 | 0.041 | 0.007 |
|  | BOX LAYER THICKNESS | 23.838 | 26.621 | 24.623 | 0.139 |
|  | FITTING PRECISION, BOX LAYER THICKNESS | 0.034 | 0.095 | 0.061 | 0.008 |
| COMPARATIVE EXAMPLE1 | BOX LAYER THICKNESS | 21.062 | 24.610 | 23.131 | 0.464 |
|  | FITTING PRECISION | 0.191 | 0.665 | 0.462 | 0.068 |
| COMPARATIVE EXAMPLE2 | SOI LAYER THICKNESS | 10.426 | 11.933 | 11.382 | 0.188 |
|  | FITTING PRECISION | 0.063 | 0.215 | 0.147 | 0.022 |
| COMPARATIVE EXAMPLE3 | SOI LAYER THICKNESS | 9.997 | 12.310 | 11.663 | 0.191 |
|  | FITTING PRECISION, SOI LAYER THICKNESS | 0.133 | 0.475 | 0.321 | 0.048 |
|  | BOX LAYER THICKNESS | 22.748 | 27.422 | 23.957 | 0.164 |
|  | FITTING PRECISION, BOX LAYER THICKNESS | 0.404 | 1.570 | 0.974 | 0.143 |

Figure 9:
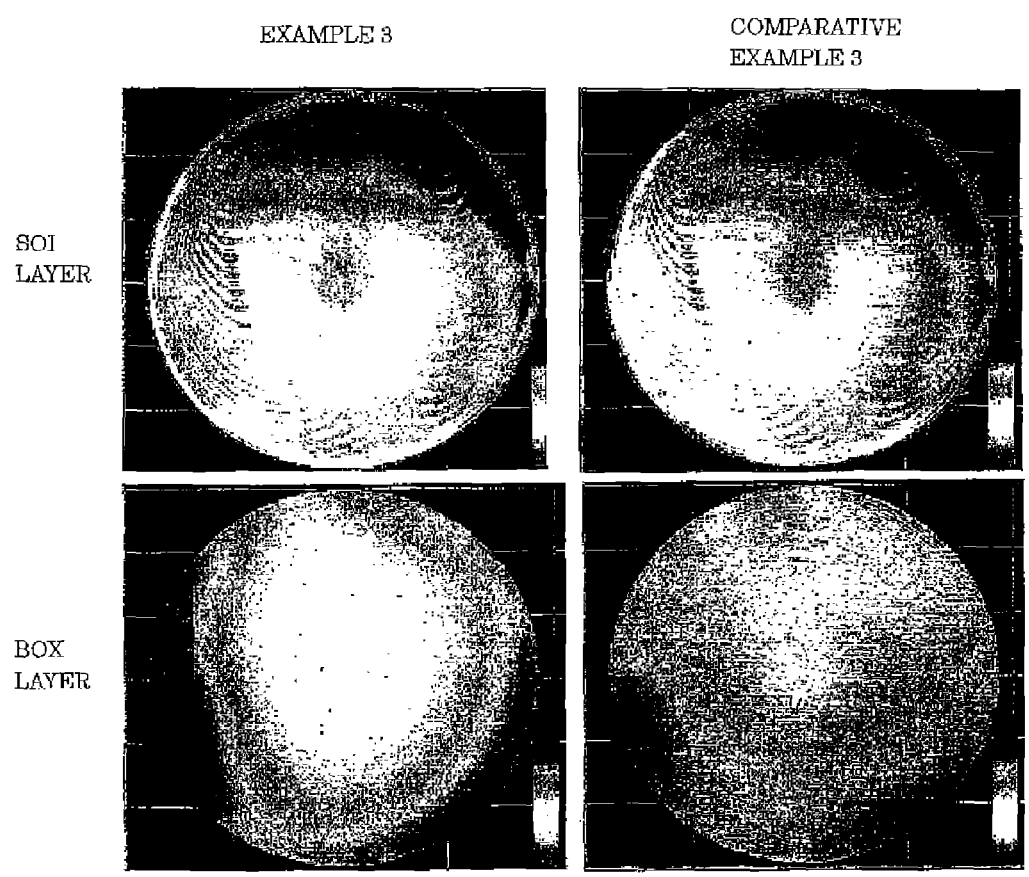
FIG. 9 depicts film thickness maps of SOI layers and buried oxide films evaluated in Example 3 and Comparative Example 3.

In FIG. 9, film thickness maps of the SOI layers and the buried oxide films measured in Example 3 and Comparative Example 3 are depicted. As depicted in FIG. 9, in both of the film thickness maps of the SOI layers, stripe patterns indicating film thickness variations of the SOI layers are observed, and the film thickness variations were actually present in the SOI layers. On the other hand, in the film thickness maps of the buried oxide films (the BOX layers), stripe patterns are observed for Comparative Example 3, which were generated by being influenced by the film thickness variations of the SOI layer and do not indicate actual film thickness variations. In other words, the stripe patterns were caused by the poor measurement precision. In contrast, Example 3 demonstrates no strip pattern because the film thickness distribution of the buried oxide film was precisely measured without being affected by the film thickness variations of the SOI layer.

It was thus confirmed that the method for measuring a film thickness distribution of the present invention can measure the film thickness distribution of a wafer with a thin film at high density, with a high degree of precision, and in a short time by using reflection spectroscopy and improve fitting precision.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for measuring a film thickness distribution of a first thin film of a first wafer with thin films by reflection spectroscopy, the first wafer having the first thin film formed on a surface of a substrate and a second thin film formed on a surface of the first thin film, the method comprising:
   calculating a profile P1 by a simulation, the profile P1 indicating wavelength dependence of a reflectance of the first wafer with respect to a light at wavelengths not less than a wavelength region of visible light, the first wafer being an object to be measured;
   calculating a profile P21 by a simulation, the profile P21 indicating wavelength dependence of a reflectance of a second wafer with respect to a light at wavelengths not less than a wavelength region of visible light, the second wafer having thin films including a second thin film that is t [nm] thinner or thicker than a set film thickness T2 of the second thin film of the first wafer;
   calculating a profile P31 (=P21−P1) of a difference between the calculated profiles P1 and P21 and obtaining a wavelength $\lambda 1$ observed when the calculated profile P31 of the difference becomes zero;
   selecting a waveband including the obtained wavelength $\lambda 1$ as a waveband of a light for use in the film thickness distribution measurement by the reflection, spectroscopy; and
   measuring the film thickness distribution of the first thin film by reflection spectroscopy, wherein a surface of the first wafer is irradiated with a light to selectively measure only reflected light at the selected waveband of reflected light from the surface of the first wafer, or wherein the surface of the first wafer is irradiated with a light at the selected waveband to measure all reflected lights of the reflected light from the surface of the first wafer.

2. The method for measuring a film thickness distribution according to claim 1, wherein
   the waveband including the obtained wavelength $\lambda 1$ is selected from a range of a wavelength $\lambda 1$ plus or minus 50 [nm].

3. A method for measuring a film thickness distribution of a second thin film of a first wafer with thin films by reflection spectroscopy, the first wafer having a first thin film formed on a surface of a substrate and the second thin film formed on a surface of the first thin film, the method comprising:
   calculating a profile P1 by a simulation, the profile P1 indicating wavelength dependence of a reflectance of the first wafer with respect to a light at wavelengths not less than a wavelength region of visible light, the first wafer being an object to be measured;
   calculating a profile P22 by a simulation, the profile P22 indicating wavelength dependence of a reflectance of a second wafer with respect to a light at wavelengths not less than a wavelength region of visible light, the second wafer having thin films including a first thin film that is t [nm] thinner or thicker than a set film thickness T1 of the first thin film of the first wafer;
   calculating a profile P32 (=P22−P1) of a difference between the calculated profiles P1 and P22 and obtaining a wavelength $\lambda 2$ observed when the calculated profile P32 of the difference becomes zero;
   selecting a waveband including the obtained wavelength $\lambda 2$ as a waveband of a light for use in the film thickness distribution measurement by the reflection, spectroscopy, and
   measuring the film thickness distribution of the first thin film by reflection, spectroscopy wherein a surface of the first wafer is irradiated with a light to selectively measure only reflected light at the selected waveband of reflected light from the surface of the first wafer, or wherein the surface of the first wafer is irradiated with a light at the selected waveband to measure all reflected lights of the reflected light from the surface of the first wafer.

4. The method for measuring a film thickness distribution according to claim 3, wherein
   the waveband including the obtained wavelength $\lambda 2$ is selected from a range of a wavelength $\lambda 2$ plus or minus 50 [nm].

5. A method for measuring film thickness distributions of a first thin film and a second thin film of a first wafer with thin films by reflection spectroscopy, the first wafer having the first thin film formed on a surface of a substrate and the second thin film formed on a surface of the first thin film, the method comprising:
   calculating a profile P1 by a simulation, the profile P1 indicating wavelength dependence of a reflectance of the first wafer with respect to a light at wavelengths not less than a wavelength region of visible light, the first wafer being an object to be measured;
   calculating a profile P21 by a simulation, the profile P21 indicating wavelength dependence of a reflectance of a second wafer with respect to a light at wavelengths not less than a wavelength region of visible light, the second wafer having thin films including a second thin film that is t [nm] thinner or thicker than a set film thickness T2 of the second thin film of the first wafer;
   calculating a profile P31 (=P21−P1) of a difference between the calculated profiles P1 and P21 and obtaining a wavelength $\lambda 1$ observed when the calculated profile P31 of the difference becomes zero;
   calculating a profile P22 by a simulation, the profile P22 indicating wavelength dependence of a reflectance of a third wafer with respect to a light at wavelengths not less than a wavelength region of visible light, the third wafer having thin films including a first thin film that is t [nm] thinner or thicker than a set film thickness T1 of the first thin film of the first wafer;

calculating a profile P32 (=P22−P1) of a difference between the calculated profiles P1 and P22 and obtaining a wavelength λ2 observed when the calculated profile P32 of the difference becomes zero;

selecting a waveband including the obtained wavelengths λ1 and λ2 as a waveband of a light for use in the film thickness distribution measurement by the reflection spectroscopy; and measuring the film thickness distribution of the first thin film and the second thin film by reflection spectroscopy, wherein a surface of the first wafer is irradiated with a light to selectively measure only reflected light at the selected waveband of reflected light from the surface of the first wafer, or wherein the surface of the first wafer is irradiated with a light at the selected waveband to measure all reflected lights of the reflected light from the surface of the first wafer.

6. The method for measuring film thickness distributions according to claim 5, wherein
the waveband including the obtained wavelengths λ1 and λ2 is selected, if λ1 <λ2, from a range of a wavelength λ1 minus 50 [nm] to a wavelength λ2 plus 50 [nm] and the waveband is selected, if λ1>λ2, from a range of a wavelength λ2 minus 50 [nm] to a wavelength λ1 plus 50 [nm].

7. The method for measuring film thickness distributions according to claim 1, wherein
the first wafer is an SOI wafer, the first thin film is a buried oxide film, and the second thin film is an SOI layer composed of silicon single crystal.

8. The method for measuring film thickness distributions according to claim 2, wherein
the first wafer is an SOT wafer, the first thin film is a buried oxide film, and the second thin film is an SOI layer composed of silicon single crystal.

9. The method for measuring film thickness distributions according to claim 3, wherein
the first wafer is an SOI wafer, the first thin film is a buried oxide film, and the second thin film is an SOI layer composed of silicon single crystal.

10. The method for measuring film thickness distributions according to claim 4, wherein
the first wafer is an SOI wafer, the first thin film is a buried oxide film, and the second thin film is an SOI layer composed of silicon single crystal.

11. The method for measuring film thickness distributions according to claim 5, wherein
the first wafer is an SOI wafer, the first thin film is a buried oxide film, and the second thin film is an SOI layer composed of silicon single crystal.

12. The method for measuring film thickness distributions according to claim 6, wherein
the first wafer is an SOI wafer, the first thin film is a buried oxide film, and the second thin film is an SOI layer composed of silicon single crystal.

* * * * *